United States Patent
Jin

(10) Patent No.: US 10,263,215 B2
(45) Date of Patent: Apr. 16, 2019

(54) OLED DEVICE PACKAGED BY THIN FILM AND THIN FILM PACKAGING METHOD OF OLED DEVICE

(71) Applicant: Wuhan China Star Optoelectronics Technology Co., Ltd., Wuhan, Hubei (CN)

(72) Inventor: Jiangjiang Jin, Guangdong (CN)

(73) Assignee: Wuhan China Star Optoelectronics Technology Co., Ltd., Wuhan, Hubei (CN)

( * ) Notice: Subject to any disclaimer, the term of this patent is extended or adjusted under 35 U.S.C. 154(b) by 174 days.

(21) Appl. No.: 15/328,404

(22) PCT Filed: Dec. 26, 2016

(86) PCT No.: PCT/CN2016/112137
§ 371 (c)(1),
(2) Date: Jan. 23, 2017

(87) PCT Pub. No.: WO2018/082168
PCT Pub. Date: May 11, 2018

(65) Prior Publication Data
US 2018/0294435 A1    Oct. 11, 2018

(51) Int. Cl.
*H01L 51/52* (2006.01)
*H01L 51/56* (2006.01)

(52) U.S. Cl.
CPC ...... *H01L 51/5253* (2013.01); *H01L 51/5268* (2013.01); *H01L 51/56* (2013.01)

(58) Field of Classification Search
None
See application file for complete search history.

(56) References Cited

U.S. PATENT DOCUMENTS

2003/0127973 A1\* 7/2003 Weaver ............... H01L 51/5268
 313/504
2010/0330716 A1 12/2010 Tyan
(Continued)

FOREIGN PATENT DOCUMENTS

CN 102738403 A 10/2012
CN 102751447 A 10/2012
(Continued)

*Primary Examiner* — Shaun M Campbell
(74) *Attorney, Agent, or Firm* — Andrew C. Cheng

(57) ABSTRACT

The disclosure discloses an OLED device packaged by a thin film, including an OLED display device and at least one packaging structure packaged on the OLED display device. The packaging structure includes a first inorganic packaging layer made by waterproof inorganic material, an organic scattering layer disposed on the first inorganic packaging layer and a second inorganic packaging layer disposed on the organic scattering layer. The organic scattering layer is configured to improve optical coupling output of the OLED display device. The second inorganic packaging layer is made by waterproof inorganic material. The disclosure discloses a thin film packaging method of the OLED device. According to the disclosure, the inorganic waterproof packaging layer and the organic scattering layer disposed on the OLED display device can guarantee enough ability of preventing water and oxygen of the OLED device with relatively high optical coupling output.

8 Claims, 3 Drawing Sheets

(56) References Cited

U.S. PATENT DOCUMENTS

| | | | | |
|---|---|---|---|---|
| 2012/0256218 A1* | 10/2012 | Kwack | ................ | H01L 51/5256 257/98 |
| 2013/0168712 A1* | 7/2013 | Jeong | .................. | H01L 51/5275 257/98 |
| 2018/0040854 A1* | 2/2018 | Sung | ................... | H01L 51/5237 |

FOREIGN PATENT DOCUMENTS

| | | | |
|---|---|---|---|
| CN | 102870250 A | 1/2013 |
| CN | 103518269 A | 1/2014 |
| CN | 103996629 A | 8/2014 |
| CN | 104981728 A | 10/2015 |
| CN | 105378965 A | 3/2016 |
| CN | 106057857 A | 10/2016 |

\* cited by examiner

OLED DEVICE PACKAGED BY THIN FILM AND THIN FILM PACKAGING METHOD OF OLED DEVICE

TECHNICAL FIELD

The disclosure relates to an organic light-emitting display device technical field, and more particularly to an OLED device packaged by a thin film and a thin film packaging method of an OLED device.

DESCRIPTION OF RELATED ART

In recent years, an organic light-emitting diode (OLED) has been a popular nascent flat panel display product around the world because the OLED display is self-luminous, widely viewed (above 175°, quickly responded (1 µs) with high light-emitting efficiency, wide color gamut and a low working voltage (3~10V), as well as a thin thickness (below 1 mm), capable of producing a large-sized flexible panel and being made with a simple process, further including potential of low costs.

In a top-emitting OLED device, the OLED device should be guaranteed to have enough ability of water and oxygen prevention as well as relative high optical coupling output. However, a conventional top-emitting OLED device fails to satisfy the two conditions simultaneously.

SUMMARY

An objective of the disclosure is to provide an OLED device packaged by a thin film, including an OLED display device and at least one packaging structure packaged on the OLED display device. The packaging structure includes a first inorganic packaging layer made by waterproof inorganic material, an organic scattering layer disposed on the first inorganic packaging layer and a second inorganic packaging layer disposed on the organic scattering layer. The organic scattering layer is configured to improve optical coupling output of the OLED display device. The second inorganic packaging layer is made by waterproof inorganic material.

In an embodiment of the disclosure, the OLED device packaged by a thin film further includes an organic buffer layer disposed between the organic scattering layer and the second inorganic packaging layer. The organic buffer layer is configured to buffer stress generated due to bending or folding.

In an embodiment of the disclosure, a surface of the first inorganic packaging layer has a nano-porous structure. The organic scattering layer includes a plurality of ellipsoidal particles, each of the ellipsoidal particles is on the surface of the first inorganic packaging layer between two corresponding pores.

Another objective of the disclosure is to provide a method of packaging an OLED device by a thin film, including preparing a first inorganic packaging layer on an OLED display device utilizing waterproof inorganic material, preparing an organic scattering layer on the first inorganic packaging layer utilizing organic material, the organic scattering layer is configured to improve optical coupling output of the OLED display device, preparing a second inorganic packaging layer on the organic scattering layer utilizing waterproof inorganic material.

Still another objective of the disclosure is to provide a method of packaging an OLED device by a thin film, including preparing a first inorganic packaging layer on an OLED display device utilizing waterproof inorganic material, preparing an organic scattering layer on the first inorganic packaging layer utilizing organic material, the organic scattering layer is configured to improve optical coupling output of the OLED display device, preparing an organic buffer layer on the organic scattering layer utilizing organic material, the organic buffer layer is configured to buffer stress generated due to bending or folding, preparing a second inorganic packaging layer on the organic scattering layer utilizing waterproof inorganic material.

In an embodiment of the disclosure, a method of preparing the organic scattering layer includes printing a layer of organic thin film layer on the organic scattering layer utilizing organic material, and irradiating the organic thin film layer by ultraviolet light to solidify the organic thin film layer so as to form the organic buffer layer.

In an embodiment of the disclosure, a method of preparing the first inorganic packaging layer includes preparing an inorganic thin film layer on the OLED display device utilizing waterproof inorganic material, and etching a surface of the inorganic thin film layer to form a nano-porous structure.

In an embodiment of the disclosure, a method of preparing the organic scattering layer includes printing a layer of organic thin film layer on a surface of the first inorganic packaging layer utilizing organic material, and irradiating the organic thin film layer by ultraviolet light to solidify and form a plurality of ellipsoidal particles on the first inorganic packaging layer, each of the ellipsoidal particles is disposed on the surface of the first inorganic packaging layer between two corresponding pores.

The inorganic waterproof packaging layer and the organic scattering layer disposed on the OLED display device according to the disclosure can guarantee enough ability to prevent water and oxygen of the OLED device with relatively high optical coupling output.

BRIEF DESCRIPTION OF THE DRAWINGS

The above and other aspects, features and advantages of embodiments of the disclosure will be clearer by the following description with reference to accompanying drawings.

DETAILED DESCRIPTION OF PREFERRED EMBODIMENTS

Embodiments of the disclosure will be described in detail with reference to the accompanying drawings as follows. However, the disclosure can be implemented in various forms, and the disclosure should be explained beyond the concrete embodiments. On the contrary, the provided embodiments are for illustrating the principle and practical application of the disclosure, so that a person skilled in the art can understand various embodiments of the disclosure and modifications adapted to specific applications.

In the figures, thicknesses of layers and regions are exaggerated to clarify devices. An identical label represents the same device in the embodiments and figures.

It should further be known that when a layer is called to be on another layer or device, it can be on another layer or device directly, or a middle layer can be disposed between the two.

Figure 1:
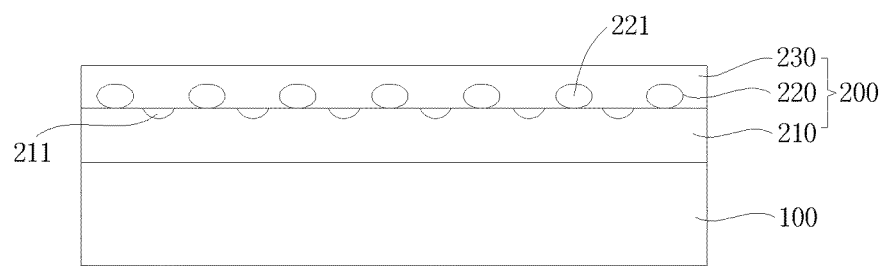
FIG. 1 is a structural schematic view of an OLED device packaged by a thin film according to a first embodiment of the disclosure.

FIG. 1 is a structural schematic view of an OLED device packaged by a thin film according to a first embodiment of the disclosure.

Referring to FIG. 1, the OLED device packaged by a thin film according to the first embodiment of the disclosure includes an OLED display device 100 and a packaging structure 200 packaged on the OLED display device 100. In FIG. 1, only one packaging structure 200 is shown, but the disclosure has no such limitation. Two, three or more packaging structures 200 can be overlapped and packaged on the OLED display device 100 as an example.

The OLED display device 100 can be a flexible top-emitting OLED device, but the disclosure goes farther than that. The packaging structure 200 includes a first inorganic packaging layer 210, an organic scattering layer 220 and a second inorganic packaging layer 230.

The first inorganic packaging layer 210 is disposed on the OLED display device 100. For instance, the first inorganic packaging layer 210 can be prepared by plasma enhanced chemical vapor deposition (PECVD), atomic layer deposition (ALD), pulsed laser deposition or sputter. The first inorganic packaging layer 210 can be made by waterproof inorganic material such as $Al_2O_3$, $TiO_2$, $SiN_x$, $SiCN_x$, $SiO_x$, etc.

Figure 2:
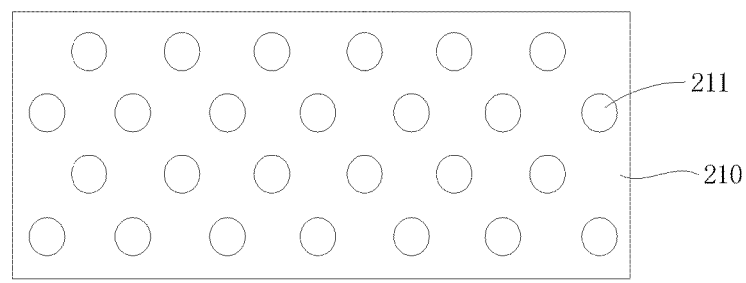
FIG. 2 is a top view of a surface of a first inorganic packaging layer according to the first embodiment of the disclosure.

Furthermore, a surface of the first inorganic packaging layer 210 can be formed with a nano-porous structure. FIG. 2 is a top view of a surface of a first inorganic packaging layer according to the first embodiment of the disclosure. Referring to FIG. 1 and FIG. 2, the surface of the first inorganic packaging layer 210 has a plurality of nano pores 211 arranged as an array, functions thereof will be described as follows. It should be clarified that the shape of the nano pores 211 is not restricted to circles shown in FIG. 2, ellipses, triangles, rectangles or other proper shapes can be adopted as well.

The organic scattering layer 220 is disposed on the first inorganic packaging layer 210. Specifically, the first inorganic packaging layer 210 is printed with a layer of organic thin film layer with relative high viscosity (no less than 40 Pa·s) by ink-jet printing, then the organic thin film layer is irradiated by ultraviolet light to be solidified and form the organic scattering layer 220. Organic material to prepare the organic thin film layer can be acrylic, hexamethyldisiloxane (HMDSO), polyacrylate, polycarbonate, polystyrene, etc.

During irradiation by ultraviolet light, the surface of the first inorganic packaging layer 210 has dual functions of a nano porous structure and high viscosity of the organic thin film layer, the organic thin film layer on the nano pores 211 will flow into the nano pores 211, and the organic thin film layer on a surface of the first inorganic packaging layer 210 among the nano pores 211 will stay, further forming ellipsoidal particles 221 with a relatively wide contact angle in the ultraviolet light solidification process. Distances of adjacent ellipsoidal particles 221 can be preset according to practical requirements, diameters of the ellipsoidal particles 221 can be controlled by various spraying doses of drippings during ink-jet printing.

The second inorganic packaging layer 230 is disposed on the organic scattering layer 220. For instance, the second inorganic packaging layer 230 can be prepared by plasma enhanced chemical vapor deposition (PECVD), atomic layer deposition (ALD), pulsed laser deposition or sputter. The second inorganic packaging layer 230 can be made by waterproof inorganic material such as $Al_2O_3$, $TiO_2$, $SiN_x$, $SiCN_x$, $SiO_x$, etc. Moreover, the second inorganic packaging layer 230 can buffer stress generated due to bending or folding of the device.

Figure 3:
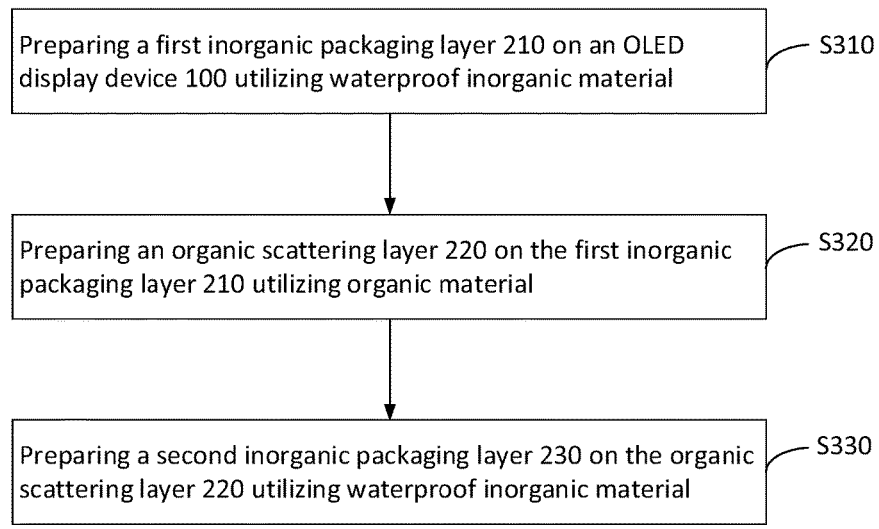
FIG. 3 is a flowchart of a packaging method of the OLED device packaged by a thin film shown in FIG. 1.

FIG. 3 is a flowchart of a packaging method of the OLED device packaged by a thin film shown in FIG. 1.

Referring to FIG. 1 through FIG. 3, the packaging method of the OLED device packaged by a thin film according to the first embodiment of the disclosure includes following steps.

S310, preparing the first inorganic packaging layer 210 on the OLED display device 100 utilizing waterproof inorganic material.

The method of preparing the first inorganic packaging layer 210 includes, firstly, preparing an inorganic thin film layer with a thickness of 1~2 μm on the OLED display device 100 by plasma enhanced chemical vapor deposition (PECVD), atomic layer deposition (ALD), pulsed laser deposition or sputter. The inorganic thin film layer can be made by waterproof inorganic material such as $Al_2O_3$, $TiO_2$, $SiN_x$, $SiCN_x$, $SiO_x$, etc.

Subsequently, the surface of the inorganic thin film layer is etched by a mask with a width of 10~30 nm and a length of 10~200 nm, an etching thickness is 1~100 nm, finally a layer of multiple extra waterproof nano pores 211 arranged in an array are formed on the surface of the inorganic thin film layer, called a nano-porous structure, specifically as shown in FIG. 2.

S320, preparing the organic scattering layer 220 on the first inorganic packaging layer 210 utilizing organic material. The organic scattering layer 220 is configured to improve optical coupling output of the OLED display device 100. The organic material can be acrylic, hexamethyldisiloxane (HMDSO), polyacrylate, polycarbonate, polystyrene, etc.

The method of preparing the organic scattering layer 220 includes, firstly, printing a layer of organic thin film layer with relative high viscosity (no less than 40 Pa·s) on the first inorganic packaging layer 210 by ink-jet printing.

Subsequently, the organic scattering layer 220 is solidified and formed by irradiation of ultraviolet light. During irradiation by ultraviolet light, the surface of the first inorganic packaging layer 210 has dual functions of a nano porous structure and high viscosity of the organic thin film layer, the organic thin film layer on the nano pores 211 will flow into the nano pores 211, and the organic thin film layer on a surface of the first inorganic packaging layer 210 among the nano pores 211 will stay, further forming ellipsoidal particles 221 with a relatively wide contact angle in the ultraviolet light solidification process. Distances of adjacent ellipsoidal particles 221 can be preset according to practical requirements, diameters of the ellipsoidal particles 221 can be controlled by various spraying doses of drippings during ink-jet printing.

S330, preparing the second inorganic packaging layer 230 on the organic scattering layer 220 utilizing waterproof inorganic material. The second inorganic packaging layer 230 with a thickness of 1~2 μm can be prepared on the organic scattering layer 220 by plasma enhanced chemical vapor deposition (PECVD), atomic layer deposition (ALD), pulsed laser deposition or sputter. The second inorganic packaging layer 230 can be made by waterproof inorganic material such as $Al_2O_3$, $TiO_2$, $SiN_x$, $SiCN_x$, $SiO_x$, etc.

Figure 4:
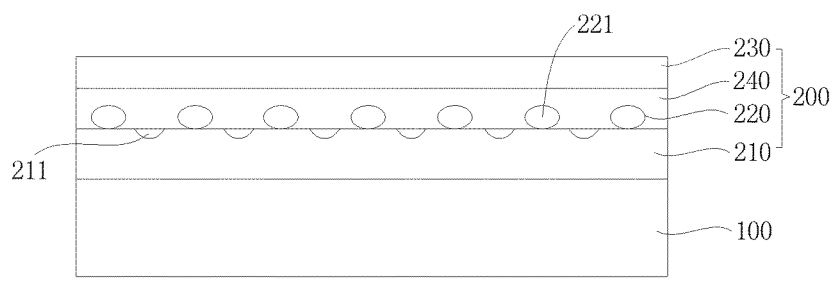
FIG. 4 is a structural schematic view of an OLED device packaged by a thin film according to a second embodiment of the disclosure.

FIG. 4 is a structural schematic view of an OLED device packaged by a thin film according to a second embodiment of the disclosure.

Referring to FIG. 4, a different structure compared with the OLED device packaged by a thin film shown in FIG. 1 is that the packaging structure 200 of the OLED device packaged by a thin film according to the second embodiment of the disclosure further includes an organic buffer layer 240 disposed between the organic scattering layer 220 and the second inorganic packaging layer 230. The organic buffer layer is configured to buffer stress generated due to bending or folding of the device and cover particle contamination. Specifically, a layer of organic thin film layer with a thickness of 2~3 μm can be printed on the organic scattering layer 220 by ink-jet printing, then the organic buffer layer 240 is solidified and formed by irradiation of ultraviolet light. The organic buffer layer 240 can be made by organic material such as acrylic, hexamethyldisiloxane (HMDSO), polyacrylate, polycarbonate, polystyrene, etc.

Figure 5:
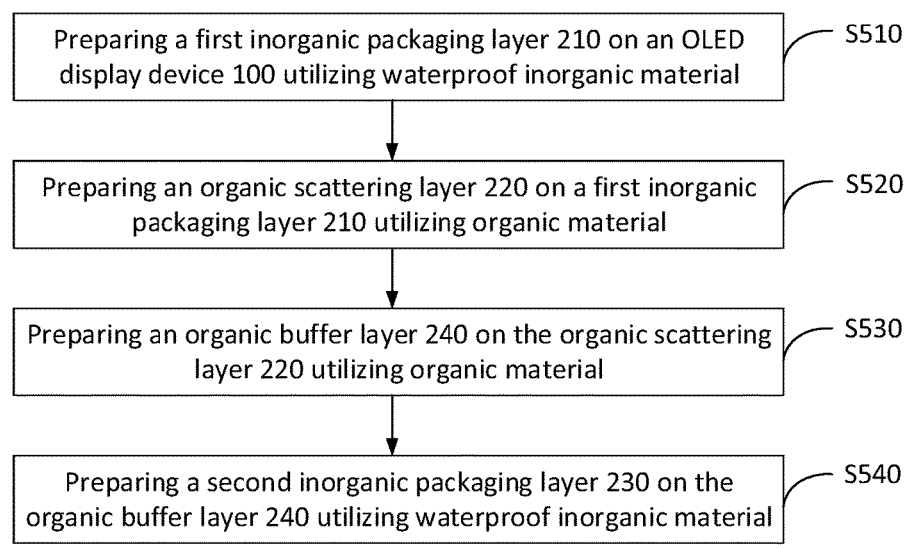
FIG. 5 is a flowchart of a packaging method of the OLED device packaged by a thin film shown in FIG. 4.

FIG. 5 is a flowchart of a packaging method of the OLED device packaged by a thin film shown in FIG. 4.

Referring to FIG. 5, a difference compared with the packaging method of the OLED device packaged by a thin film shown in FIG. 3 is in step S530, the organic buffer layer 240 is prepared on the organic scattering layer 220 utilizing organic material. The organic buffer layer 240 is configured to buffer stress generated due to bending or folding.

The specific method of preparing the organic buffer layer 240 includes, firstly, printing a layer of organic thin film layer with a thickness of 2~3 μm on the organic scattering layer 220 by ink-jet printing. Secondly, the organic buffer layer 240 is solidified and formed by irradiation of ultraviolet light.

In step S540, the second inorganic packaging layer 230 is prepared on the organic buffer layer 240 utilizing waterproof inorganic material. The preparation method of the second inorganic packaging layer 230 is identical to the preparation method of the second packaging layer 230 in step S330, which will not be repeated.

Overall, according to the OLED device packaged by a thin film and the thin film packaging method of the OLED device of each of the embodiments of the disclosure, the inorganic waterproof packaging layer and the organic scattering layer disposed on the OLED display device can guarantee enough ability of preventing water and oxygen of the OLED device with relatively high optical coupling output.

Although the disclosure is illustrated with reference to specific embodiments, a person skilled in the art should understand that various modifications on forms and details can be achieved within the spirit and scope of the disclosure limited by the claims and the counterpart.

What is claimed is:

1. An OLED device packaged by a thin film, comprising an organic light-emitting diode (OLED) display device and at least one packaging structure packaged on the OLED display device, the packaging structure comprising:
    a first inorganic packaging layer, made by waterproof inorganic material;
    an organic scattering layer, disposed on the first inorganic packaging layer, the organic scattering layer configured to improve optical coupling output of the OLED display device;
    a second inorganic packaging layer, disposed on the organic scattering layer, the second inorganic packaging layer made by waterproof inorganic material,
    wherein a surface of the first inorganic packaging layer has a nano-porous structure, the organic scattering layer comprises a plurality of ellipsoidal particles, each of the ellipsoidal particles is on the surface of the first inorganic packaging layer between two corresponding pores.

2. The OLED device packaged by a thin film according to claim 1, wherein the OLED device further comprises an organic buffer layer, the organic buffer layer disposed between the organic scattering layer and the second inorganic packaging layer, the organic buffer layer is configured to buffer stress generated due to bending or folding.

3. A method of packaging an OLED device by a thin film, comprising:
    preparing a first inorganic packaging layer on an OLED display device utilizing waterproof inorganic material;
    preparing an organic scattering layer on the first inorganic packaging layer utilizing organic material; the organic scattering layer configured to improve optical coupling output of the OLED display device;
    preparing a second inorganic packaging layer on the organic scattering layer utilizing waterproof inorganic material,
    wherein a method of preparing the organic scattering layer comprises:
    printing a layer of organic thin film layer on a surface of the first inorganic packaging layer utilizing organic material; and
    irradiating the organic thin film layer by ultraviolet light to solidify and form a plurality of ellipsoidal particles on the first inorganic packaging layer, each of the ellipsoidal particles disposed on the surface of the first inorganic packaging layer between two corresponding pores.

4. The method of packaging an OLED device by a thin film according to claim 3, wherein a method of preparing the first inorganic packaging layer comprises:
    preparing an inorganic thin film layer on the OLED display device utilizing waterproof inorganic material;
    etching a surface of the inorganic thin film layer to form a nano-porous structure.

5. A method of packaging an OLED device by a thin film, comprising:
    preparing a first inorganic packaging layer on an OLED display device utilizing waterproof inorganic material;
    preparing an organic scattering layer on the first inorganic packaging layer utilizing organic material; the organic scattering layer configured to improve optical coupling output of the OLED display device;
    preparing an organic buffer layer on the organic scattering layer utilizing organic material; the organic buffer layer configured to buffer stress generated due to bending or folding;
    preparing a second inorganic packaging layer on the organic scattering layer utilizing waterproof inorganic material,
    wherein a method of preparing the organic scattering layer comprises:
    printing a layer of organic thin film layer on a surface of the first inorganic packaging layer utilizing organic material; and
    irradiating the organic thin film layer by ultraviolet light to solidify and form a plurality of ellipsoidal particles on the first inorganic packaging layer, each of the ellipsoidal particles disposed on the surface of the first inorganic packaging layer between two corresponding pores.

6. The method of packaging an OLED device by a thin film according to claim 5, wherein a method of preparing the organic buffer layer comprises:
    printing a layer of organic thin film layer on the organic scattering layer utilizing organic material;
    irradiating the organic thin film layer by ultraviolet light to solidify the organic thin film layer so as to form the organic buffer layer.

7. The method of packaging an OLED device by a thin film according to claim 5, wherein a method of preparing the first inorganic packaging layer comprises:
    preparing an inorganic thin film layer on the OLED display device utilizing waterproof inorganic material;
    etching a surface of the inorganic thin film layer to form a nano-porous structure.

8. The method of packaging an OLED device by a thin film according to claim 6, wherein a method of preparing the first inorganic packaging layer comprises:
    preparing an inorganic thin film layer on the OLED display device utilizing waterproof inorganic material;
    etching a surface of the inorganic thin film layer to form a nano-porous structure.

* * * * *